US007459248B2

(12) United States Patent
Word

(10) Patent No.: US 7,459,248 B2
(45) Date of Patent: Dec. 2, 2008

(54) PERFORMING OPC ON STRUCTURES WITH VIRTUAL EDGES

(76) Inventor: James Word, 10943 SW. Adele Dr., Portland, OR (US) 97225

( * ) Notice: Subject to any disclaimer, the term of this patent is extended or adjusted under 35 U.S.C. 154(b) by 351 days.

(21) Appl. No.: 11/067,466

(22) Filed: Feb. 24, 2005

(65) Prior Publication Data

US 2006/0188796 A1    Aug. 24, 2006

(51) Int. Cl.
*G03F 9/00*         (2006.01)
(52) U.S. Cl. ............................................. 430/30; 430/5
(58) Field of Classification Search ..................... 430/5, 430/30
See application file for complete search history.

(56) References Cited

U.S. PATENT DOCUMENTS

| | | | |
|---|---|---|---|
| 4,762,396 | A | 8/1988 | Dumant et al. |
| 5,502,654 | A | 3/1996 | Sawahata |
| 5,655,110 | A | 8/1997 | Krivokapic et al. |
| 5,723,233 | A | 3/1998 | Garza et al. |
| 5,825,647 | A | 10/1998 | Tsudaka |
| 5,879,844 | A | 3/1999 | Yamamoto et al. |
| 6,016,357 | A | 1/2000 | Neary et al. |
| 6,049,660 | A | 4/2000 | Ahn et al. |
| 6,077,310 | A | 6/2000 | Yamamoto et al. |
| 6,120,952 | A | 9/2000 | Pierrat et al. |
| 6,128,067 | A | 10/2000 | Hashimoto |
| 6,187,483 | B1 | 2/2001 | Capodieci et al. |
| 6,243,855 | B1 | 6/2001 | Kobayashi et al. |
| 6,249,904 | B1 | 6/2001 | Cobb |
| 6,263,299 | B1 | 7/2001 | Aleshin et al. |
| 6,269,472 | B1 | 7/2001 | Garza et al. |
| 6,317,859 | B1 | 11/2001 | Papadopoulou |
| 6,370,679 | B1 | 4/2002 | Chang et al. |
| 6,425,117 | B1 | 7/2002 | Pasch et al. |
| 6,453,452 | B1 | 9/2002 | Chang et al. |
| 6,453,457 | B1 | 9/2002 | Pierrat et al. |
| 6,467,076 | B1 | 10/2002 | Cobb |
| 6,499,003 | B2 | 12/2002 | Jones et al. |
| 6,665,845 | B1 | 12/2003 | Aingaran et al. |
| 6,927,003 | B2 * | 8/2005 | Kim et al. .................. 430/5 |
| 7,017,141 | B2 | 3/2006 | Anderson et al. |
| 2006/0236294 | A1 * | 10/2006 | Saidin et al. .............. 716/19 |

FOREIGN PATENT DOCUMENTS

| | | |
|---|---|---|
| JP | 09319067 A | 12/1997 |
| JP | 11-102380 A | 4/1999 |
| JP | 2004-502961 A | 1/2004 |
| WO | WO 99/14637 A1 | 3/1999 |
| WO | WO 01/65315 A2 | 9/2001 |
| WO | WO 01/97096 A1 | 12/2001 |

OTHER PUBLICATIONS

Mentor Graphics Corporation, News & Views, Mar. 1999, <http://www.mentorg.co.jp/N-V/99_3/dsm.html> [retrieved Nov. 7, 2006].
Mentor Graphics Corporation, News & Views, Mar. 1999, <http://www.mentorg.co.jp/N-V/99_3/opc.html> [retrieved Nov. 7, 2006].
Mentor Graphics Corporation, News & Views, Apr. 2000, <http://www.mentorg.co.jp/N-V/00_04/ppower.html> [retrieved Nov. 7, 2006].
Cobb, N., and Y. Granik, "Model-Based OPC Using the MEEF Matrix," *Proceedings of SPIE*, vol. 4889: *22nd Annual BACUS Symposium on Photomask Technology*, Monterey, Calif., Sep. 30-Oct. 4, 2002, p. 147.
Cobb, N., and A. Zakhor, "Experimental Results on Optical Proximity Correction With Variable Threshold Resist Model," *Proceedings of SPIE*, vol. 3051: *Symposium on Optical Microlithography X*, Santa Clara, Calif., Mar. 10-14, 1997, pp. 458-468.
Cobb, N., and A. Zakhor, "Fast, Low-Complexity Mask Design," *Proceedings of SPIE*, vol. 2440: *Symposium on Optical/Laser Microlithography VIII*, Santa Clara, Calif., Feb. 22-24, 1995, pp. 313-327.
Cobb, N., and A. Zakhor, "Fast Sparse Aerial Image Calculation for OPC," *Proceedings of SPIE*, vol. 2621: *15th Annual BACUS Symposium on Photomask Technology and Management*, Santa Clara, Calif., Sep. 20-22, 1995, pp. 534-545.
Cobb, N., and A. Zakhor, "Large Area Phase-Shift Mask Design," *Proceedings of SPIE*, vol. 2197: *Symposium on Optical/Laser Microlithography VII*, San Jose, Calif., Mar. 2-4, 1994, pp. 348-360.
Cobb., N., et al., "Mathematical and CAD Framework for Proximity Correction," *Proceedings of SPIE*, vol. 2726: *Symposium on Optical Microlithography IX*, Santa Clara, Calif., Mar. 13-15, 1996, pp. 208-222.
Cobb, N., and Y. Granik, "Using OPC to Optimize for Image Slope and Improve Process Window," (Nov. 20, 2002), *Proceedings of SPIE*, vol. 5130: *Photomask Japan*, Yokohama, Japan, Apr. 16-18, 2003, p. 42.
Granik, Y., "Generalized MEEF Theory," *Interface 2001*, Nov. 2001.
Granik, Y., and N. Cobb, "MEEF as a Matrix," *Proceedings of SPIE*, vol. 4562: *21st Annual BACUS Symposium on Photomask Technology*, Monterey, Calif., Oct. 2-5, 2001, pp. 980-991.
Granik, Y., and N. Cobb, "Two-Dimensional G-MEEF Theory and Applications," *Proceedings of SPIE*, vol. 4754: *Symposium on Photomask and Next-Generation Lithography Mask Technology IX*, Yokohama, Japan, Apr. 23-25, 2002, pp. 146-155.
Maurer, W., et al., "Process Proximity Correction Using an Automated Software Tool," *Proceedings of SPIE*, vol. 3334: *Optical Microlithography XI*, Santa Clara, Calif., Feb. 22-27, 1998, pp. 245-253.
Maurer, W., et al., "Evaluation of a Fast and Flexible OPC Package: OPTISSIMO," *Proceedings of SPIE*, vol. 2884: *16th Annual Symposium on Photomask Technology and Management*, Redwood City, Calif., Sep. 18-20, 1996, pp. 412-418.
Ohnuma, H., et al., "Lithography Computer Aided Design Technology for Embedded Memory in Logic," *Japanese Journal of Applied Physics 37*(12B):6686-6688, Dec. 1998.

* cited by examiner

*Primary Examiner*—Christopher G Young
(74) *Attorney, Agent, or Firm*—Klarquist Sparkman, LLP

(57) ABSTRACT

A method for compensating for optical distortions occurring in regions associated with non-phase-shifting regions in a mask or reticle. OPC or other resolution enhancement techniques are performed on one or more edge segments associated with adjacent phase-shifting regions in order to compensate for edge position errors occurring in areas corresponding to non-phase-shifting regions.

26 Claims, 6 Drawing Sheets

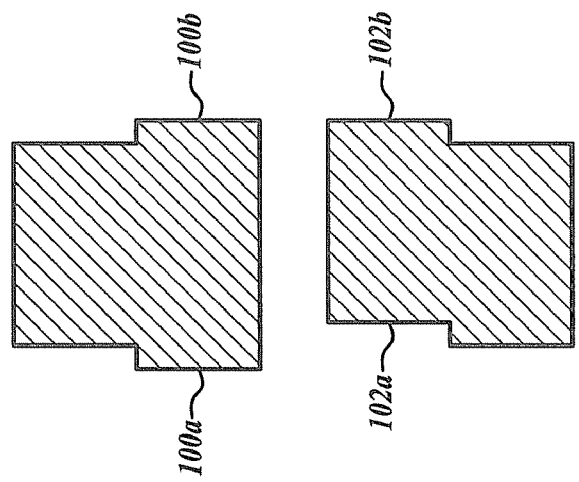
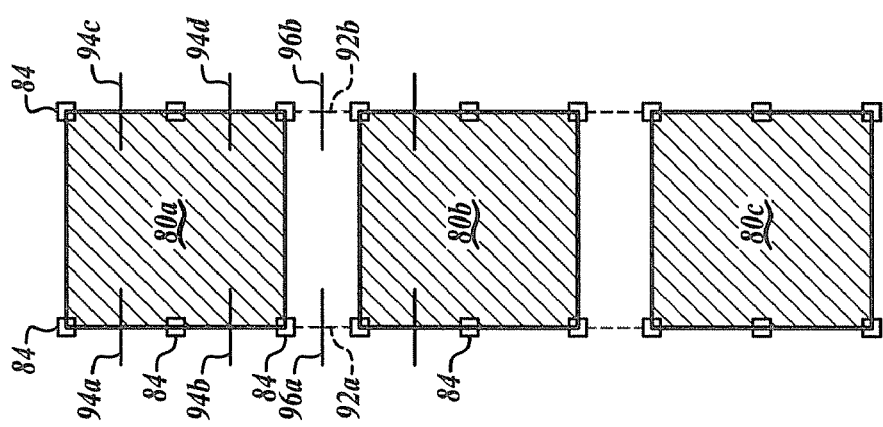

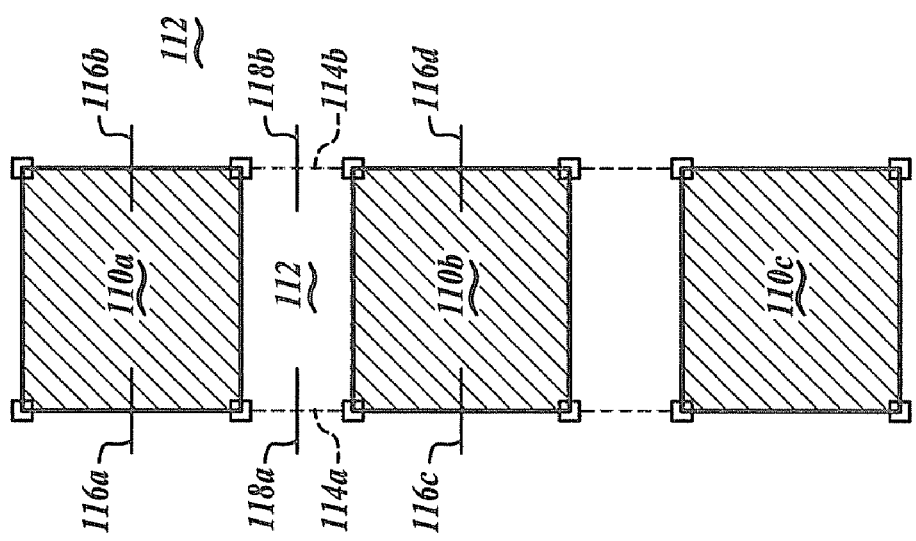

PERFORMING OPC ON STRUCTURES WITH VIRTUAL EDGES

FIELD OF THE INVENTION

The present invention relates to photolithographic processing and in particular to performing optical and process correction (OPC) on structures to be created with phase-shifters.

BACKGROUND OF THE INVENTION

In an effort to create an ever increasing number of features on an integrated circuit, many circuit designers are employing a variety of techniques to decrease the size of a feature that can be created with a photolithographic process on a wafer. One technique commonly used to create small features on a wafer is to use phase-shifters instead of opaque feature patterns on a photolithographic mask or reticle. With a phase-shifter, light is shifted 180° out of phase with respect to the phase of light passing through an adjacent non-phase-shifting portion of the mask or reticle. The interfering non-phase shifted and phase-shifted light produces a dark region of very high contrast with the surrounding bright background, enabling the selective patterning of circuit features FIG. 1 illustrates a representative pattern of features on a photolithographic mask or reticle that are used to selectively expose areas on a semiconductor wafer. The mask patterns include a number of opaque chrome patterns 10 that form corresponding features on a wafer in a conventional manner. In addition, the mask includes a number of sub-resolution features (SRAFs) 20 whose dimensions are too small to be resolved on the wafer by the photolithographic printing system, but aid in the exposure of adjacent areas. In addition, the mask includes a number of phase-shifting regions 30 that are designed to shift the illumination light by 180° compared with light that passes through adjacent clear or non-phase-shifting areas 40 that surround the phase-shifters. The phase-shifting regions 30 are typically formed by etching the quartz substrate by a desired amount or by placing a phase-shifting film on the mask substrate material. In addition, the mask layout shown in FIG. 1 includes a number of phase gratings 50 that are formed by alternating patterns of phase-shifting regions 30 and non-phase-shifting regions 40. Phase gratings can be used to form any arbitrarily shaped polygon in an integrated circuit.

FIGS. 2A-2C illustrate how a desired feature can be created with a phase grating and what optical distortions can occur in the printing process. FIG. 2A shows a desired feature pattern 60 to be created on a semiconductor wafer. To create the pattern with a phase grating, the feature pattern 60 shown in FIG. 2A is divided up into a number of phase-shifting regions 62. As shown in FIG. 2B, the phase-shifting regions shift the phase of the light passing through the phase-shifting regions by 180° compared with the light passing through the non-phase-shifting regions 64 that surround the phase-shifting regions. When exposed with an illumination light, the phase grating patterns create a feature pattern 70 as shown in FIG. 2C. Comparing the pattern 70 that is created on a wafer with the desired pattern 60, as shown in FIG. 2A, it can be seen that some distortions may occur. For example, an area 72 comprises a pinched region that, if severe enough, may affect the operation of the circuit in which the feature 70 is located.

To counteract for the distortions that may occur when the object 70 is created on a semiconductor wafer, many circuit designers utilize one or more resolution enhancement techniques (RETs) such as optical and process correction (OPC) that attempt to pre-compensate for optical distortions that will occur during the printing process. With traditional OPC, some edges of the mask patterns are moved in order to enhance the fidelity of the image printed on the semiconductor wafer. In a phase grating structure, the only edges that can be adjusted are associated with the phase-shifting regions. If an expected edge position error (EPE) is found in a region that does not have a corresponding edge that can be adjusted, it has been previously impossible to correct for the expected error. Therefore, there is a need for a mechanism for improving the fidelity of features to be created with phase-shifting patterns, such as phase gratings, in order to improve the printing fidelity in regions that do not have corresponding feature edges that can be moved.

SUMMARY OF THE INVENTION

To solve the problems described above, the present invention is a method for enhancing the fidelity of objects to be printed using phase-shifters on a photolithographic mask or reticle. Features to be created on a photolithographic wafer are formed with phase-shifting regions having edge segments that are positioned adjacent to non-phase-shifting regions that have virtual edges. In order to improve the edge position error (EPE) of a feature in an area that corresponds to a virtual edge, OPC is performed on one or more edges of the adjacent phase-shifting regions. In one embodiment, the amount by which an edge of a phase-shifting region is moved is determined based on the EPE at a virtual edge and an adjacent edge segment of a phase-shifting region.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 3A-3B illustrate one method of compensating for edge position errors at a virtual edge in accordance with one embodiment of the present invention;

FIG. 4 illustrates another method of compensating for edge position errors at a virtual edge in accordance with the present invention;

DETAILED DESCRIPTION OF THE PREFERRED EMBODIMENT

Figure 1:
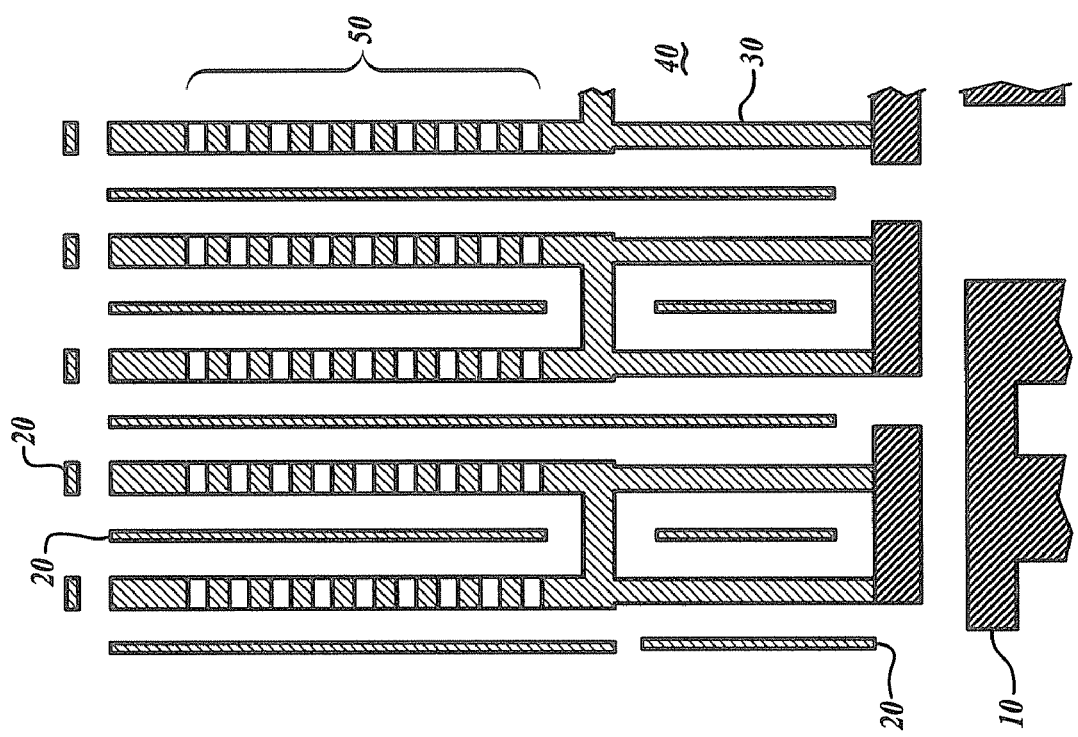
FIG. 1 illustrates a sample layout of mask features including phase gratings.
Figure 2C:
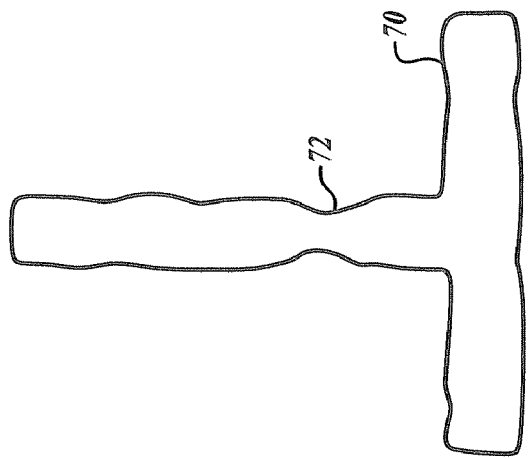
FIGS. 2A-2C illustrate how a desired feature can be created with a phase grating structure and the corresponding distortions that may occur during photolithographic printing.
Figure 2B:
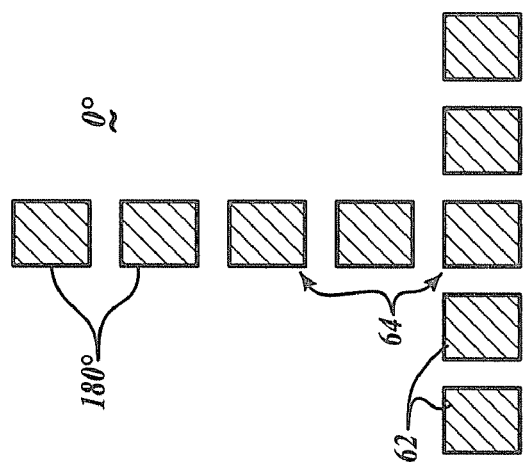
Figure 2A:
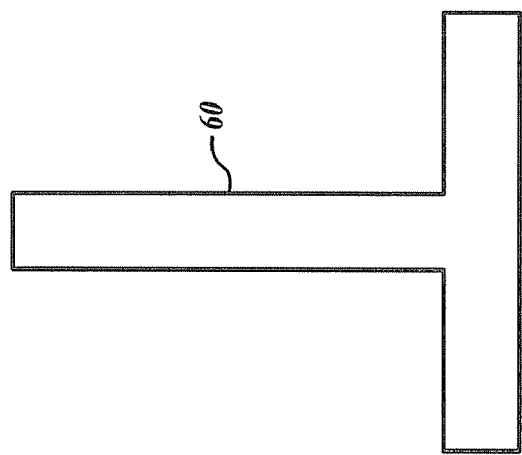

As indicated above, the present invention is a technique for improving the edge position error of a feature printed on a wafer in a region that corresponds to a virtual edge of a phase-shifter on a mask or reticle.

FIG. 3A is a greatly enlarged illustration of a phase grating structure that comprises a number of phase-shifting regions 80a, 80b, 80c, that are surrounded by and alternate with a non-phase-shifting region 90. Each of the phase-shifting regions 80a, 80b, 80c, is divided into a number of edge segments that are defined by fragmentation endpoints 84. In the example shown, the vertical edges of the phase-shifting regions 80a, 80b, 80c are divided into two edge segments by using three fragmentation endpoints 84 that are positioned at the corners of the phase-shifting regions and at the center of the vertical edges. The horizontal edges of the phase-shifting regions 80a, 80b, 80c are defined as a single edge segment. However, the horizontal edges could be divided into more than a single edge segment if desired. Between the adjacent phase-shifting regions 80a and 80b are a pair of "virtual edges" 92a, 92b that are in line with the vertical edges of phase-shifting regions 80a, 80b, etc. The edges 92a, 92b are called virtual because they are not associated with any structure on the corresponding mask or reticle.

In order to estimate the way in which the phase grating structure will produce a corresponding feature on a semiconductor wafer, simulation sites are placed on the edge segments. In the example shown, the four vertical edge segments of phase-shifting region 80a include four corresponding simulation sites 94a, 94b, 94c and 94d. The virtual edge segments 92a, 92b of the adjacent non-phase-shifting region also include corresponding simulation sites 96a, 96b. These simulation sites are used to estimate what the corresponding feature on the wafer will look like in the area of the virtual edges 92a and 92b. In the example shown, no simulation sites are placed on the horizontal edges of the phase-shifting regions. However, simulation sites could be used on these edges if desired.

An aerial image simulation of the feature created by the phase grating pattern is performed using conventional simulation techniques. At each simulation site, a determination is made of the edge position error (EPE) that specifies the difference between the actual edge that will be printed on a wafer and the desired position of the edge. Based on the determined EPEs, a decision is made if the edge segments should be moved in accordance with OPC or other resolution enhancement technique.

If, for example, the EPE calculated at the simulation site 94b indicates that an edge will not print in the desired location, the corresponding edge segment on the mask or reticle can be moved. However, if the simulation indicates that the EPE of the feature to be created on the wafer at a location corresponding to a virtual edge on a mask is too great, the error cannot be corrected with conventional OPC techniques because there is no edge that can be moved.

To overcome this limitation, the present invention moves one or more edges that are adjacent a virtual edge segment in order to compensate for EPEs occurring in locations corresponding to a virtual edge segment. For example, the edge segments associated with the simulation sites 94b and 94d, can be selectively biased outward (shown as 100a, 100b in FIG. 3B) in order to compensate for the EPEs of the virtual edge segments 92a, 92b. Similarly, the edge segments 102a, 102b associated with phase-shifting region 80b can be selectively biased to the right as shown in FIG. 3B in order to compensate for the EPE of the virtual edge 92a, 92b.

In general, the amount by which an edge segment is biased in order to compensate for an EPE occurring at an adjacent virtual edge is determined by considering both the EPE of the edge to be moved, as well as the EPE at the corresponding virtual edge. For example, the amount to be moved may be based on the average EPE of the adjacent real and virtual edges. Such average may be a straight average or a weighted average, or some other mathematical combination.

In one embodiment of the invention, the amount by which an edge is moved is determined in accordance with the formula:

$$OPC_1 = \frac{EPE_1 + EPE_2}{2} \times \text{feedback} \quad (1)$$

Where $OPC_1$ refers to the amount of correction to be applied to the edge of the phase-shifter to be moved, $EPE_1$ is the edge position error of the edge on the phase-shifter, $EPE_2$ is the edge position error of the virtual edge in question and feedback is a multiplier that is dependent on the particular photolithographic system to be used.

In some embodiments, it may not be necessary to divide the edges of the phase-shifting regions into more than one edge segment. FIG. 4 illustrates a phase grating structure that includes alternating phase-shifting regions 110a, 110b, 110c, that are separated by a non-phase-shifting region 112. In line with the vertical edges of the phase-shifting regions 110a, 110b, 110c, are virtual edge segments 114a, 114b, etc. Each of the vertical edges of phase-shifting regions includes a simulation site. For example, phase-shifting region 110a includes simulation site 116a, 116b. Phase-shifting region 110b includes simulation site 116c, 116d. In addition, the virtual edge segments 114a, 114b, include simulation sites 118a, 118b in order to compute the EPE of the feature that will be created in the region of the virtual edge segments.

In order to compensate for any optical distortions that may occur during the printing of the phase grating structure in the area of the virtual edge segments, one or more of the real edges of the phase-shifting regions 110a, 110b, 110c, may be adjusted in order to compensate for the EPE in a region of a virtual edge segment. In one embodiment, the amount that a real edge segment of a phase-shifting region is moved is based on the average EPE of the two adjacent virtual edges and the EPE of the real edge segment to be moved. Alternatively, the amount by which a real edge segment of a phase-shifting region is moved may be based on the EPE at the edge to be moved and the EPE at a single, adjacent virtual edge segment.

In some instances, it may be desirable to compensate for the EPE occurring at a virtual edge segment that is between phase-shifting regions by moving one or more of the horizontal edge segments of the phase-shifting regions. FIG. 5A illustrates a phase grating structure, including a number of alternating phase-shifting regions 140a, 140b, 140c. Each phase-shifting region 140a, 140b, 140c, is surrounded by a non-phase-shifting region 150. In line with the vertical, real edges of the phase-shifting regions are virtual edges 160a, 160b etc., of the non-phase-shifting region 150. Simulation sites 162a, 162b are placed on the vertical real edge segments of the phase-shifting regions. Simulation sites 164a, 164b are placed on the virtual edge segments 160a, 160b.

In order to compensate for the EPE of the virtual edge segments 160a, 160b, it may be necessary to adjust the position of one or more horizontal edge segments 170a, 170b of the phase-shifting regions 140a, 140b that are adjacent the virtual edge segments. The amount by which a horizontal edge segment, for example, edge segment 170a is moved, can be based on the EPE of both virtual edge segments 160a, 160b, or based on the EPE of a single virtual edge segment combined with the EPEs of one or more edge segments of the nearby or adjacent phase-shifting regions.

Figure 5B:
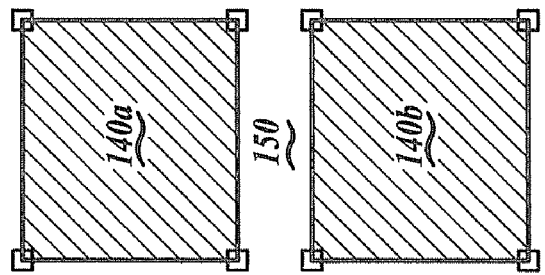
FIGS. 5A-5B illustrate yet another method of compensating for edge position errors at a virtual edge in accordance with the present invention.
Figure 5A:
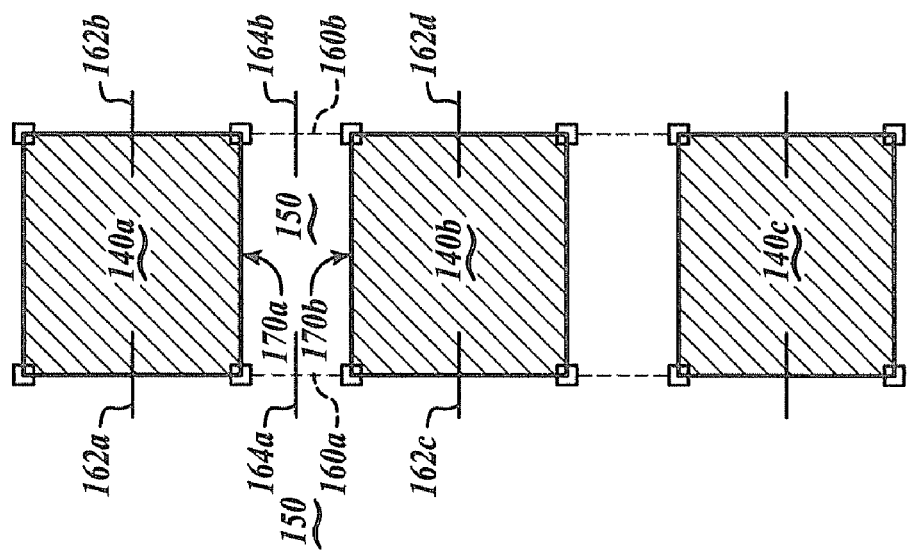

Using the present invention, the distance between adjacent phase-shifting regions (i.e. between 140a and 140b) can be adjusted in order to minimize the edge position error of the resulting structure created by the phase grating as shown in FIG. 5B. In FIG. 5A, the ratio of the size of phase-shifting regions to the interspaced, non-phase-shifting regions is approximately 2:1. However, as indicated, this can be adjusted by moving the position of the horizontal edge segments of the phase-shifting regions according to the estimated EPEs.

Figure 6:
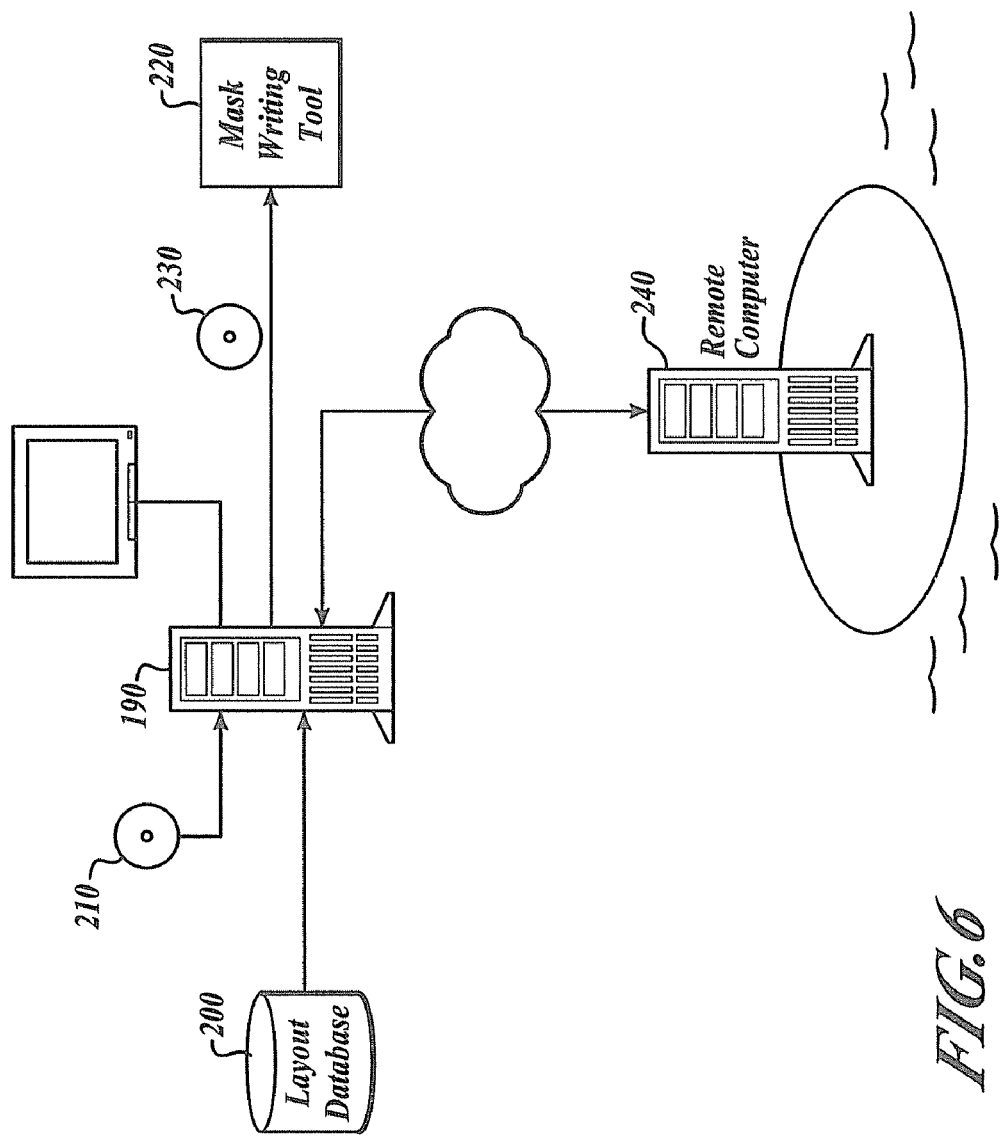
FIG. 6 illustrates one embodiment of a computer system for implementing the present invention.

FIG. 6 illustrates one embodiment of a computer system for implementing the present invention. A computer system 190 receives a layout design or portion thereof from a layout database 200, which may be stored on a computer readable media or received on a wired or wireless data communication network. The computer system 190 implements a series of instructions stored in a computer readable media, stored in a memory or received on a wired or wireless communication network 210. The instructions causes a computer system 190 to implement the RET correction system described above. The computer system 190 estimates the EPEs of features printed with edge segments of phase-shifting regions and in areas corresponding to virtual edge segments. The edge segments of one or more phase-shifting regions are then adjusted as described above to create a revised layout description. The revised layout is then provided to a mask writing tool 220. The modified layout description may be written onto a computer readable media 230 for delivering to the mask writing tool or may be transferred to the mask writing tool via a wired or wireless communication network. The mask writing tool produces one or more masks having a pattern of mask features including phase-shifters that are compensated for the expected optical distortions that may occur during printing.

Alternatively, it is possible that the computer system 190 may transmit the layout description or portion thereof to a remotely located computer 240, which may be in or outside of the United States, in order to perform the corrections and adjust the layout description to compensate for the EPEs of the virtual edges. The remotely located computer 240 can modify the layout description and return it to the local computer system 190 or supply it directly to the mask writing tool 220.

As can be seen, the present invention provides a mechanism for compensating for optical distortions occurring in regions that correspond to virtual edge segments by selectively adjusting or biasing the position of the real edge segments associated with the phase-shifting regions on a mask or reticle. Although the disclosed embodiments of the invention describe applying a resolution enhancement technique to an edge of a phase-shifting structure on a photolithographic mask, it will be appreciated that the present invention is also useful for adjusting phase-shifting patterns disposed on a reticle that is used for a photolithographic printing process. Therefore, for the purpose of the present invention, the terms "mask" and "reticle" are synonymous.

While the preferred embodiment of the invention has been illustrated and described, it will be appreciated that various changes can be made therein without departing from the scope of the invention. It is therefore intended that the scope of the invention be determined from the following claims and equivalents thereof.

The embodiment of the invention in which an exclusive property or privilege is claimed are difined as follows:

1. A method, comprising:
   associating virtual edge segments with non-phase shifting regions of a layout description for a mask;
   estimating an edge position error of a feature to be printed on a wafer in an area corresponding to a selected virtual edge segment; and
   applying a resolution enhancement technique to an edge segment of an adjacent phase-shifting region of the layout description to reduce the edge position error of the feature in the area corresponding to the selected virtual edge segment.

2. The method of claim 1, further comprising:
   estimating an edge position error of a feature to be printed on the wafer in an area corresponding to the edge segment to which the resolution enhancement technique is to be applied and applying the resolution enhancement technique to the edge segment as a function of the edge position error in the area corresponding to the edge segment and the edge position error in the area corresponding to the selected virtual edge segment.

3. The method of claim 2, wherein the resolution enhancement technique applied to the edge segment is based on an average of the edge position errors in the area corresponding to the edge segment of the phase-shifting region and in the area corresponding to the selected virtual edge segment.

4. A computer readable media storing a set of instructions that when executed by a computer system causes the computer system to perform a method, the method comprising:
   associating virtual edge segments with non-phase shifting regions of a layout description for a mask;
   estimating an edge position error of a feature to be printed on a wafer in an area corresponding to a selected virtual edge segment; and
   applying a resolution enhancement technique to an edge segment of an adjacent phase-shifting region of the layout description to reduce the edge position error of the feature in the area corresponding to the selected virtual edge segment.

5. A method comprising:
   reading a portion of a layout description;
   transmitting a portion of the layout description to a remote computer that performs the method of:
   estimating an edge position error of a feature to be printed on a wafer in an area corresponding to a virtual edge segment of a non-phase-shifting region defined in a mask layout description which is based on the portion of the layout description; and
   applying a resolution enhancement technique to an edge segment of an adjacent phase-shifting region defined in the mask layout description to reduce the edge position error of the feature in the area corresponding to the virtual edge segment.

6. A method of preparing layout data for mask creation, comprising:
   receiving at least a portion of a layout description defining features to be created on a wafer with a photolithographic process;
   defining phase gratings to create one or more of the features on the wafer, the phase gratings including alternating phase-shifting regions having edges and non-phase-shifting regions associated with virtual edges that are substantially aligned with the edges of the phase shifting regions;
   estimating an edge position error of a feature to be printed at a location corresponding to a virtual edge; and
   adjusting the position of one or more edges that are adjacent the virtual edge to reduce the edge position error of the feature to be printed at the location corresponding to the virtual edge.

7. A computer storage medium storing a sequence of instructions that are executable by a computer to perform a method of preparing layout data for mask creation, the method comprising:

receiving at least a portion of a layout description defining features to be created on a wafer with a photolithoaraphic process;

defining phase gratings to create one or more of the features on the wafer, the phase gratings including alternating phase-shifting regions having edges and non-phase-shifting regions associated with virtual edges that are substantially aligned with the edges of the phase shifting regions;

estimating an edge position error of a feature to be printed at a location corresponding to a virtual edge; and adjusting the position of one or more edges that are adjacent the virtual edge to reduce the edge position error of the feature to be printed at the location corresponding to the virtual edge.

8. The computer readable media of claim 4, wherein the set of instructions causes the computer system to perform the acts of:

estimating an edge position error of a feature to be printed on the wafer in an area corresponding to the edge segment to which the resolution enhancement technique is to be applied; and applying the resolution enhancement technique to the edge segment as a function of the edge position error in the area corresponding to the edge segment and the edge position error in the area corresponding to the selected virtual edge segment.

9. The computer readable media of claim 8, wherein the set of instructions causes the computer system to perform the acts of:

applying the resolution enhancement technique to the edge segment based on an average of the edge position errors in the area corresponding to the edge segment of the phase-shifting region and in the area corresponding to the selected virtual edge segment.

10. The computer readable media of claim 4, wherein the selected virtual edge segment is a first virtual edge segment corresponding to a first edge position error and the method further comprises:

estimating a second edge position error of a feature to be printed on the wafer in an area corresponding to a second virtual edge segment; and applying the resolution enhancement technique to the edge segment as a function of the first and the second edge position errors.

11. The computer readable media of claim 10, wherein the first and the second virtual edge segments are associated with a same non-phase-shifting region.

12. The computer readable media of claim 4, wherein the resolution enhancement technique is an optical and process correction technique.

13. The method of claim 6, further comprising:
generating a mask based on the prepared layout data.

14. The method of claim 13, further comprising:
producing an integrated circuit using the mask.

15. The computer storage medium of claim 7, wherein the adjusting of the position of the one or more edges comprises changing a distance between a pair of phase-shifting regions adjacent the virtual edge.

16. The computer storage medium of claim 7, wherein the method further comprises:

estimating an edge position error at a location corresponding to one of the one or more edges that are adjacent to the virtual edge, wherein the amount by which the position of the one or more edges is adjusted is at least partially determined from the edge position error at the location corresponding to the one of the one or more edges.

17. The computer storage medium of claim 16, wherein the virtual edge is a first virtual edge and the method further comprises:

estimating an edge position error at a location corresponding to a second virtual edge, wherein the amount by which the position of the one or more edges is adjusted is at least partially determined from an average of the edge position error at the location corresponding to the one of the one or more edges, the edge position error at the location corresponding to the first virtual edge, and the edge position error at the location corresponding to the second virtual edge.

18. A computer readable media storing a set of instructions that when executed by a computer causes the computer to perform a method, the method comprising:

receiving data representing phase-shifting regions and non-phase-shifting regions of a mask layout, wherein at least one of the phase-shifting regions is associated with one or more edge segments and at least one of the non-phase-shifting regions is associated with one or more virtual edge segments;

determining an edge position error for one of the virtual edge segments; and modifying the data representing the phase-shifting regions by moving one or more of the edge segments adjacent to the one of the virtual edge segments such that the edge position error is reduced.

19. The computer readable media of claim 18, wherein the amount by which the one or more edge segments adjacent to the one of the virtual edge segments are moved is based in part on the edge position error of the one of the virtual edge segments.

20. The computer readable media of claim 18, wherein the amount by which the one or more edge segments adjacent to the one of the virtual edge segments are moved is based in part on respective one or more edge position errors of the one or more of the edge segments.

21. The computer readable media of claim 18, wherein the amount by which the one or more edge segments adjacent to the one of the virtual edge segments are moved is based in part on a mathematical combination of edge position errors, including the edge position error of the one of the virtual edge segments.

22. The computer readable media of claim 18, wherein the one of the virtual edge segments is a first virtual edge segment having a first edge position error and the method further comprises:

determining a second edge position error of a second virtual edge segment; and wherein the amount by which the one or more of the edge segments adjacent to the first virtual edge segments are moved is based in part on an average of the first and the second edge position errors.

23. The computer readable media of claim 18, wherein the one of the virtual edge segments is a first virtual edge segment having a first edge position error and the method further comprises:

determining a second edge position error of a second virtual edge segment;

determining an edge position error of one of the one or more of the edge segments; and wherein the amount by which the one or more edge segments adjacent to the first virtual edge segments are moved is based in part on an average of the first edge position error, the second edge position error, and the edge position error of the one of the one or more of the edge segments.

24. The computer readable media of claim 18, wherein the method further comprises associating one or more simulation sites with the one of the virtual edge segments, wherein the edge position error of the one of the virtual edge segments is based on an aerial image simulation at the one or more simulation sites.

25. The computer readable media of claim 18, wherein the one of the virtual edge segments is positioned substantially perpendicular to the one or more of the edge segments.

26. The computer readable media of claim 18, wherein the moving of the one or more edge segments adjacent to the one of the virtual edge segments comprises adjusting a distance between adjacent phase-shifting regions.

* * * * *